United States Patent
Buchanan et al.

(10) Patent No.: US 6,660,140 B2
(45) Date of Patent: *Dec. 9, 2003

(54) SPUTTERING APPARATUS

(75) Inventors: Keith Edward Buchanan, Monmouthsire (GB); Stephen Robert Burgess, Gwent (GB); Paul Rich, Gloucestershire (GB)

(73) Assignee: Trikon Holdings Limited, Gwent (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 264 days.

(21) Appl. No.: 09/477,819

(22) Filed: Jan. 5, 2000

(65) Prior Publication Data

US 2002/0000374 A1 Jan. 3, 2002

(51) Int. Cl.⁷ ................................................ C23C 14/34
(52) U.S. Cl. ............................ 204/298.06; 204/298.12; 204/298.18; 204/298.26
(58) Field of Search ....................... 204/192.12, 298.03, 204/298.06, 298.08, 298.09, 298.11, 298.12, 298.18, 298.26

(56) References Cited

U.S. PATENT DOCUMENTS

| | | | | |
|---|---|---|---|---|
| 4,622,121 A | * | 11/1986 | Wegmann et al. | 204/298.18 |
| 4,731,539 A | | 3/1988 | Xu | 250/492.1 |
| 5,178,739 A | * | 1/1993 | Barnes et al. | 204/192.12 |
| 5,382,339 A | * | 1/1995 | Aranovich | 204/192.12 |
| 5,423,970 A | | 6/1995 | Kugler | 204/298.03 |
| 5,427,668 A | | 6/1995 | Sato et al. | 204/298.05 |
| 5,707,498 A | * | 1/1998 | Ngan | 204/192.12 |

FOREIGN PATENT DOCUMENTS

| | | |
|---|---|---|
| EP | 0 627 497 A1 | 12/1994 |
| EP | 0 807 954 A1 | 11/1997 |
| EP | 0 818 566 A1 | 1/1998 |
| GB | 1 069 977 | 12/1964 |
| GB | 1 369 863 | 10/1974 |
| GB | 2 204 596 A | 11/1988 |

* cited by examiner

*Primary Examiner*—Rodney G. McDonald
(74) *Attorney, Agent, or Firm*—Volentine Francos, PLLC

(57) ABSTRACT

In a sputtering apparatus for depositing material onto a workpiece, an RF coil is disposed in a chamber between a first target and a workpiece support. The RF coil includes a re-sputtering surface of electrically conductive non-target material which faces towards the workpiece support and which receives a coating of target material for re-sputtering onto the workpiece. A second target, located between the RF coil and the workpiece support, includes a sputtering surface which faces towards the RF coil and which supplies at least a portion of the coating of target material to the re-sputtering surface of the RF coil.

2 Claims, 3 Drawing Sheets

SPUTTERING APPARATUS

This invention relates to sputtering apparatus for depositing material onto a workpiece.

It is well known that material can be sputtered from a target, ionised in a vacuum chamber and subsequently attracted to a workpiece, such as a semi-conductor wafer by means of electric fields.

A convenient means of ionising the sputtered material is to use an immersed coil, driven at radio frequencies, and such an arrangement is described in "Fundamental Characteristics of built-in high-frequency coil-type sputtering apparatus", J. Vac. Sci. Technol. A 7(2), March/April 1989. However to ionise a sufficiently high proportion of the sputtered material, a relatively high (~30 mT) chamber pressure is needed. This pressure, combined with the presence of the ionising RF coil, creates an unacceptably high non-uniformity in the deposition across the workpiece e.g. typically 20%–30% standard deviation of surface thickness. Although highly non-uniform, the deposition on the substrate can be engineered to have radial symmetry; the centre being thickest and the edge being thinnest. Such symmetry allows for the possibility of compensating for such non-uniformity by the addition of a secondary source of sputtered material positioned concentrically around the substrate. The second source will preferably deposit material at the substrate edge giving an overall thickness profile that is acceptably uniform e.g. a standard deviation of surface thickness <8%.

A two part target is described in U.S. Pat. No. 4,606,806 and comprises an inner planar part and a frusto-conical outer part. In EP-A-0807954 the compensatory target comprises a solenoid annulus of target material which serves both as the ionising coil and the secondary sputter source. This arrangement has the considerable disadvantage that the coil/secondary target is very expensive to manufacture as the grade of metal has to be around 99.999% refined and it needs to be replaced frequently as it is consumed. The forming of such materials is very expensive and it is extremely difficult to cool them in an economic fashion. This is disadvantageous, because the resultant thermal stress results in flaking. Thus in EP-A-0807954 a shield ring is provided to prevent sputtering from the primary target onto the secondary target/coil. For many processes this works reasonably well, but problems arise in the common process requirement to deposit varied layers upon semi-conductor wafers consisting of Ti followed by TiN, preferably within the same chamber. The TiN is deposited by flowing small quantities of nitrogen during Ti sputtering processes. This causes Titanium target surfaces to nitride and Titanium Nitride is sputtered onto the substrate surface.

Ti and TiN have very different thermal expansion coefficients and any thermal cycling will create additional stresses causing flaking to be more likely, particularly from an un-cooled target coil. The arrangement of EP-A-0807944 does not overcome this problem sufficiently unless prohibitively long etching processes occur between the Ti and TiN processes.

The present invention sets out to mitigate at least some of these problems and certain embodiments provide significant improvements on all fronts.

From one aspect the invention consists in sputtering apparatus for depositing material onto a workpiece including a chamber, a target exposed in the chamber and a workpiece support located in the chamber opposite the target characterised in that the apparatus further comprises a re-sputtering surface disposed between the target and the workpiece of electrically conductive non-target material for receiving a coating of target material for re-sputtering onto the periphery of the workpiece to enhance uniformity of deposition and means for negatively biasing the surface to enable re-sputtering of the coating.

Preferably the re-sputtering surface is disposed generally circumjacent the support and the surface, or part of it, may be inclined towards the support. The re-sputtering surface may be in the form of a ring and the ring may be a frusto-triangle in cross section. The surface may be made of stainless steel or other suitable robust or easily formed material usable within a vacuum environment. The apparatus may further comprise an adhesion enhancing coating on the re-sputtering surface for enhancing the adhesion of target material to the surface for example a coating of molybdenum.

An RF coil may be disposed in the chamber between the target and the re-sputtering surface. In this case the RF coil is preferably formed of non-target material and has an external surface or surfaces for receiving a coating of target material to prevent sputtering of the non-target material. Conveniently the re-sputtering surface is located between the coil and the support so that it can sputter material onto that part of the coil which is in shadow with respect to the target.

The coil and/or the re-sputtering surface may be hollow to define a passage for liquid coolant therein and the coil may be made of stainless steel or other suitable material.

In any of these cases at least part of the coating on the re-sputtering surface and/or the coil may be provided by sputtering from the target during a pre-treatment operation of the apparatus, i.e. an operation which takes place prior to the positioning of a workpiece on the support.

This may preferentially take place simultaneously with the pre-sputtering of the target as is common practice prior to deposition upon a workpiece. A shutter is generally employed to avoid sputter material depositing upon the workpiece support.

The apparatus may include control means for operating the apparatus in the first pre-treatment mode, in which there is no workpiece, to coat the re-sputtering surface and/or the coil with target material for the subsequent process and in a second deposition mode in which target material is also deposited on the workpiece. The control means may include a computer program to calculate the necessary conditions for the first mode for any particular selected second mode operation.

From a further aspect the invention may consist in sputter apparatus for treating a workpiece including a chamber, a target disposed in the chamber, a workpiece support located in the chamber opposite the target and an RF coil disposed within the chamber between the target and the support characterised in that the coil is made from non-target material and carries, or is provided with prior to and/or during treatment of a workpiece, a coating of target material and in that a further target is located between the coil and the support for sputtering materials onto that part of the coil which is in shadow with respect to the first mentioned target.

The further target may be annular and may be generally a frusto-triangle in section. The coil and/or the further target may be hollow to define a passage for liquid coolant therein and each or either of them may be made of stainless steel. The coating on the coil may be provided at least partially by sputtering from the targets during a pre-treatment operation of the apparatus or, when the further target it itself made of non-target material and coated, from the first target primarily.

The coil is preferably operated at frequencies, powers and in modes that minimise its DC potential thus minimising its net sputtering thus ensuring it remains coated with target material throughout workpiece processing. It may be operated at net ground potential, segmented or in any way at as low a negative DC bias as is consistent with the process.

From a further aspect the invention consists in sputtering apparatus for depositing material onto a workpiece including a chamber and a target disposed in the chamber characterised in that the apparatus further comprises a re-sputtering surface of electrically conductive non-target material for receiving a coating of target material for re-sputtering and means for controlling the biasing of the surface such that a coating is formed on the surface and is also re-sputtered in a manner that there is always a coating of target material present, on substantially all the re-sputtering surface during the sputter deposition onto a workpiece.

The invention also consists in a method of operating sputtering apparatus including pre-coating elements of the apparatus which are made of non-target material so that the non-target material is not sputtered during treatment operation and/or the uniformity of deposition is enhanced. The invention may also include other steps set out above.

Although the invention has been defined above it is to be understood it includes any inventive combination of the features set out above or in the following description.

The invention may be performed in various ways and a specific embodiment will now be described, by way of example with reference to the accompanying drawings, in which.

Figure 1:
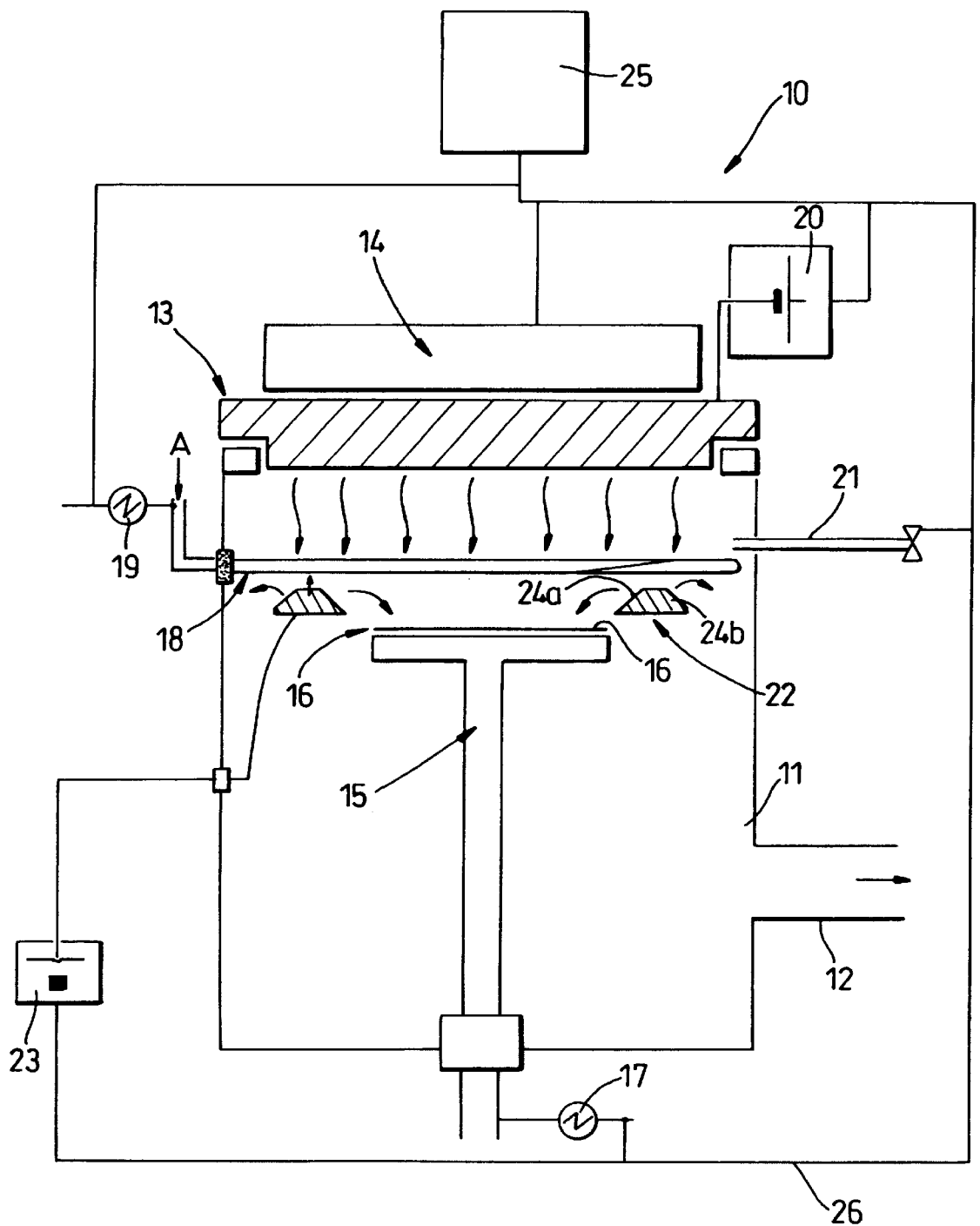
FIG. 1 is a schematic view of sputtering apparatus.

A sputtering apparatus, generally indicated at 10, is shown schematically in FIG. 1. The apparatus 10 includes a vacuum chamber 11 having an evacuation outlet 12, which is connected to a pump (not shown). The upper end of the chamber 11 is substantially formed by a target 13 made of highly refined target material and this is surmounted by a magnetron assembly 14 which is constructed and operated, as is well known in the art, to enhance even wear of the target 13. A workpiece or wafer support 15 is located to support a workpiece 16 opposite the target 13 and may be biased by an RF power supply 17. A coil 18 is disposed within the chamber 11 between the support 15 and the target 13 to ionise material sputtered from the target 13 so that it can be preferentially directed towards the wafer 16 by an negative bias on the support 15. The coil 18 is powered by an RF supply 19 and the target 13 is negatively DC biased by a DC power supply 20. A gas inlet 21 is provided to allow the introduction of the gas which creates the ions that sputter material from the target 13 and any further reactions e.g. in reactive sputtering.

Up to this point, the apparatus is essentially conventional and its operation is well understood within the art. The procedures are particularly well described in Chapter 6 of Glow Discharge Processes by Brian Chapman and published by John Wyllie and Sons and the relevant sections of that Chapter are incorporated herein by reference.

However, as has been explained before, there are problems in forming coils from target material and with achieving uniform deposition. These are addressed in the current Application by the following features:

1. The coil 18 is formed of a stainless steel tube so that it defines a passage for liquid coolant (e.g. water) which can be passed through the coil as shown at arrow A.

2. The coil 18 can be pre-coated with a target material prior to construction, but more typically it will be at least partially coated with target material by running the apparatus 11 in a pre-treatment operation, which is a standard part of the operation of such apparatus in any case. In either case the coating protects against sputtering of the stainless steel tube and ensure that any material re-sputtered from the coil during treatment of the workpiece is target material. Further deposition of target material will take place during the workpiece treatment phase.

3. A secondary target or re-sputtering surface may be provided by a ring 22, which is disposed circumjacent the support 15 and between the support and the coil 18. The ring 22 may re-sputter a target material onto that part of the coil 18 which is in shadow vis-a-vis the target 13.

4. The ring 22 is preferably formed of target material, but may be itself formed of stainless steel and gain its coating of target material, for re-sputtering from the target both during the pre-treatment operation and during workpiece processing. In this case it may be hollow and cooled and again the stainless steel could be protected.

5. The target ring 22 is positioned and shaped so as to sputter material preferentially towards the edge of the wafer 16 and thus enhance uniformity. To ensure it remains coated with target material its negative bias (by a DC or RF power supply 23) is carefully controlled by a central controller 25. The target ring 22 is provided with an inclined surface 24*a* to enhance preferential sputtering onto the edge of the wafer 16 and may have further included face 24*b* to reach the outer parts of the coil 18.

6. The coil 18 and/or the ring 22 may be pre-coated with a material such as molybdenum to enhance the adhesion of the target material or indeed may carry a pre-coat of target material.

It will be seen that the combination of these features both deals with the problem of uniformity and also enables the use of a relatively inexpensive coolable immersed coil. The annular target provides the uniformity compensation and either of these features can be utilised independently. If the coil is used independently of the target ring, then dark space shielding may be utilised to overcome the potential exposure of stainless steel to ionisation.

It will be understood the shape, location and size of the target ring 22 may vary in accordance with the geometry of any particular chamber or workpiece and indeed the process to be run. In general the ring will be no larger in size than the main target 13 and will be located opposite that target. The inner sloping surface 24*a* will generally be at an obtuse angle with respect to the substrate surface. The power supplies 23 and 17 may be formed by a single power supply.

The operation of the apparatus can be greatly enhanced by proper control and it will be observed that the power supplies, valves and pump are connected to a central control 25, by leads 26. The control apparatus 25 preferably includes a computer which can be pre-programmed to calculate the required operating sequence and thicknesses to be deposited during the pre-treatment and deposition stages.

Figure 2:
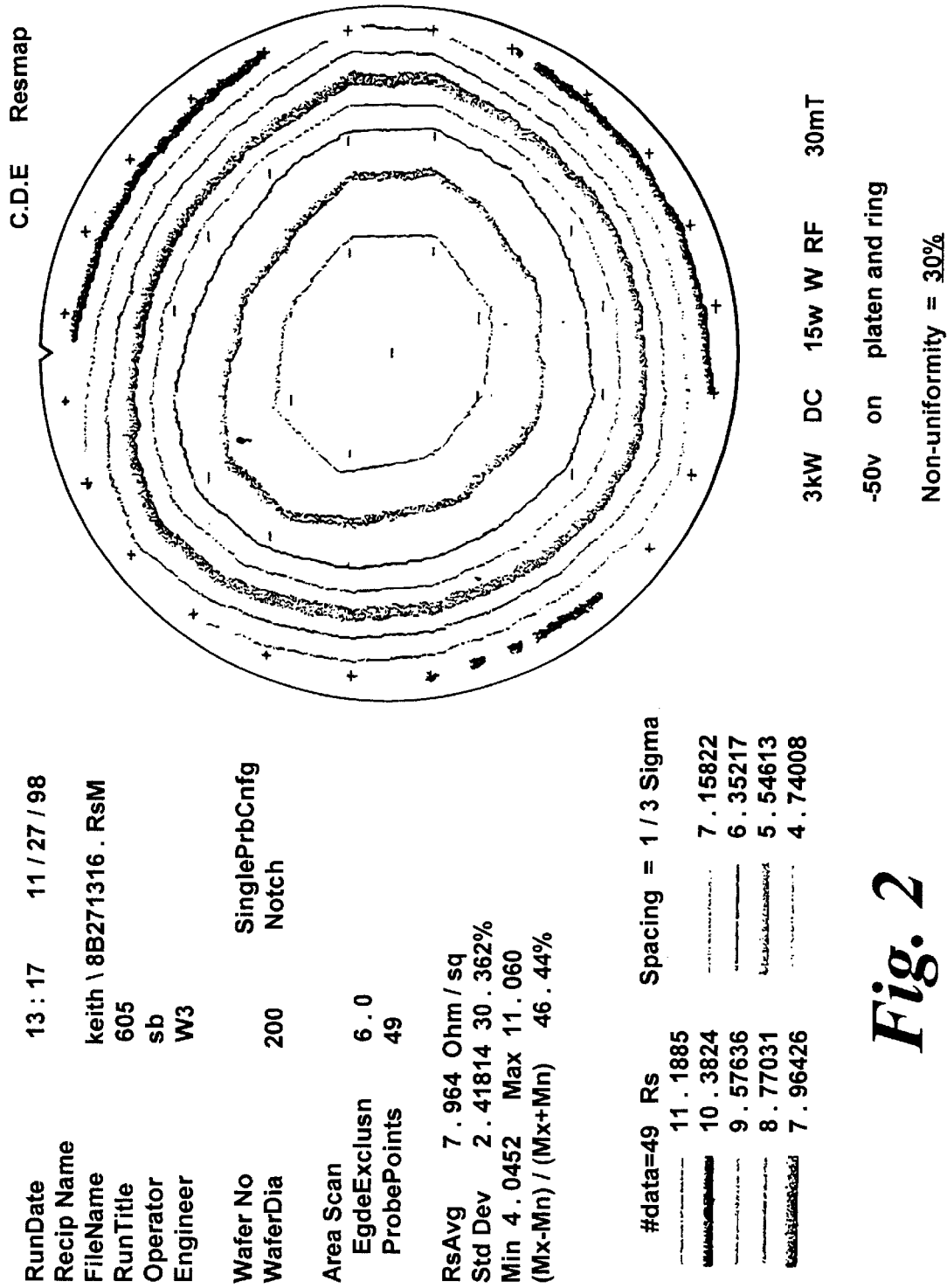
FIG. 2 is a chart and table indicating levels of uniformity during operation of the sputtering apparatus in one condition.
Figure 3:
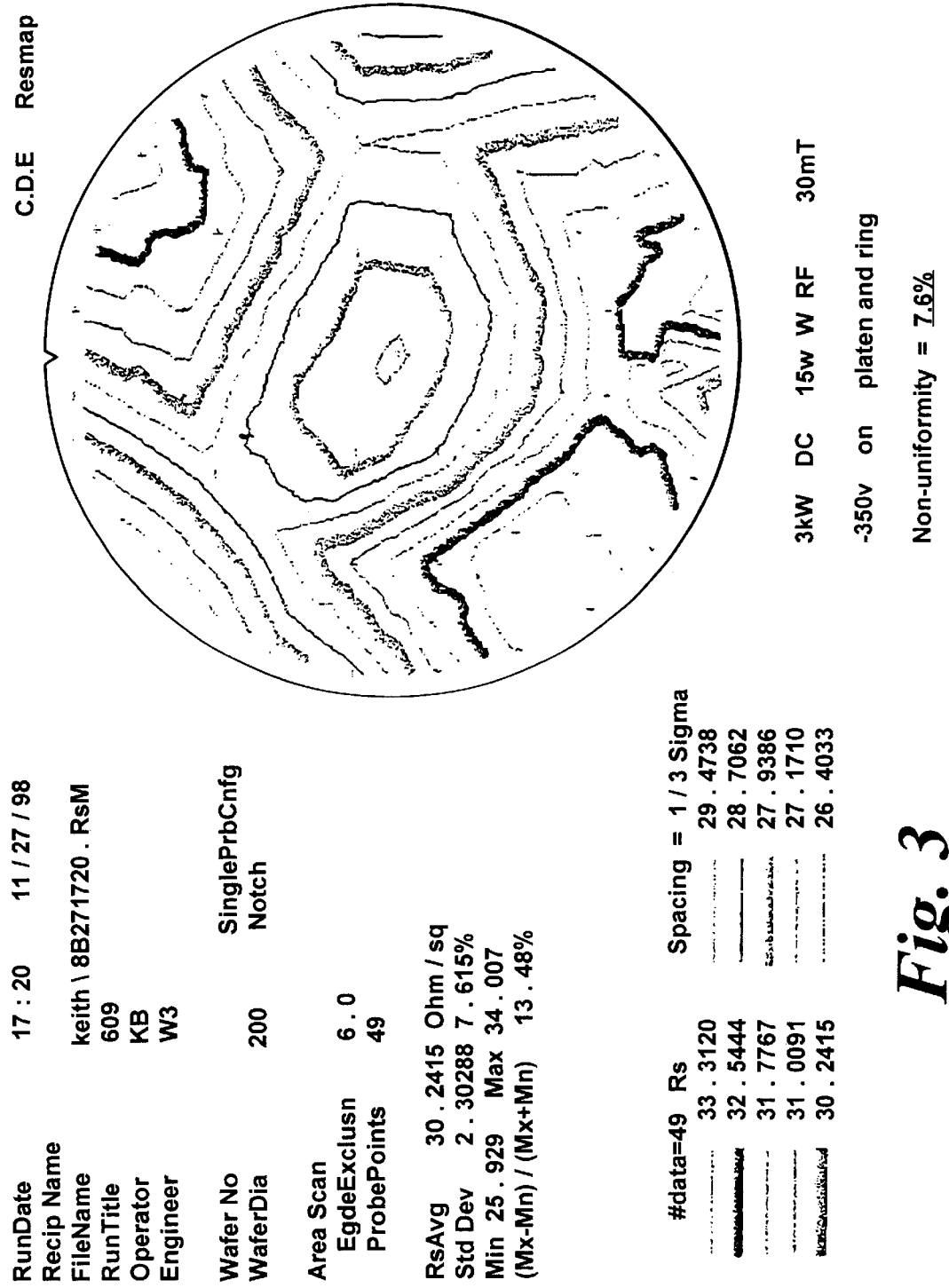
FIG. 3 is the equivalent table and diagram to FIG. 3 for a preferred set of conditions.

The apparatus described in FIG. 1 has been utilized for the ionised sputtering for Titanium. In each case the target was operated at 3 kw DC, the ionising coil at 1.5 kw RF and argon was supplied at a pressure of 30 mT. In the first example the wafer and the ring 22 were DC biased to the relatively low value of minus 50 v by a shared power supply which gave a standard deviation of film thickness (non-uniformity) of 30%. This more or less standard result indicates that the bias voltage is close to or below the threshold for re-sputtering to occur for that particular target material and the uniformity improvement is accordingly not present. These results are illustrated in FIG. 2. In FIG. 3 the DC bias on the wafer and ring was −350 volts thus significantly increasing the re-sputtering from the ring and the non-uniformity was reduced to 7.6%. The measurements are by means of resistivity mapping and equi-resistive lines are shown as a "contour" map.

This experiment thus demonstrated the use of a re-sputtering ring to improve uniformity of deposition in an ionised sputtering apparatus.

Further experimentation has been done and by way of example the following results have been achieved:

| Thickness of material | Bias to Dummy target: | | | |
|---|---|---|---|---|
| | Improvement | | | |
| in nanometers at: | Off | On | absolute | Percentage |
| Centre Field | 83 | 99 | 16 | 19% |
| Centre base of hole | 64 | 80 | 16 | 25% |
| Edge field | 55 | 89 | 34 | 61% |
| Edge base of hole | 37 | 61 | 35 | 64% |

It will be noted that, in absolute terms, the increase in thickness of deposited material is almost the same at the base of the holes and in the field. This suggests that, surprisingly, the resputtered material is highly ionised.

Further experimentation has suggested that the angle of the inner slope 24a is preferably in the region of 50° and an angle of 53° has proved to be particularly suitable. In practice 2 Mhz has proved to be a suitable driving frequency for a single turn coil.

When sputtering TiN the wafer has been typically biased to minus 30 to 40 volts DC and the resputtering ring has been driven at over 1000V DC to give acceptable uniformity across the wafer field. The high DC voltage is due to the current being clamped by the RF coil and it may therefore be desirable to use a pulsed DC or RF power supply for lower yield material such as TiN. By such means the voltage may be reduced on the resputtering ring. High voltages present problems for vacuum feedthroughs and arcing to shielding and chamber parts.

An optimised process sequence which allows for effective pre-sputter coating of the coil and the further target, for a DRAM interconnection liner is as follows:

1. Cover wafer support 15 with a shutter and power titanium 13 at e.g. 15,000 W DC for 30 seconds at 12 mT. This step is carried out prior to sputtering titanium onto wafers in all commercial sputtering systems and particularly in this process flow as the previous material sputtered will have been titanium nitride and this the target surface will be nitrogen contaminated. In this system this target cleaning step also 'pastes' fresh target material onto the ionising coil and the re-sputtering surace of the second target 22.

2. Load wafer, Open shutter.

3. Sputter titanium, typically 20 nm thick.

Process:
    750 W DC power applied to the target magnetron 14
    250 W DC applied to the re-sputtering second target 22
    1,000 W of 2 MHz RF power applied to a DC ground potential ionising coil 18
    −35 volts DC bias to the wafer by 13.56 mhz RF power
    35 mT, 60 seconds.

During this step only ex-target material is re-sputtered material from the second target 22.

4. Sputter titanium nitride, typically 40 nm thick

Process:
    4,000 W DC power applied to the target magnetron 14
    2,200 W DC applied to the re-sputtering surface target 22
    3,000 W of 2 MHz RF power applied to a DC ground potential ionising coil 18
    −35 volts DC bias to the wafer by 13.56 mhz RF power
    25 mT, 70 seconds During this step the re-sputtered material is consumed and some of the re-sputtering target 22 is also consumed and thus this experiment requires the re-sputtering target 22 to have at least a surface of material essentially identical to the target material.

The RF ionising coil does not sputter because, it is DC grounded and thus it is not subjected to significant sputtering forces (ionic bombardment) yet it is deposited upon the targets and thus there is net deposition of target material to the RF ionizing coil.

Results over a batch of 25 wafers yielded the following results:

| Wafer cassette slot number | Average sheet resistivity (Ohms/sq.) | Non-Uniformity % age std. dev |
|---|---|---|
| 5 | 8.5 | 6.1 |
| 10 | 8.6 | 5.8 |
| 20 | 8.8 | 5.7 |
| 25 | 8.6 | 5.5 |

What is claimed is:

1. Sputtering apparatus for depositing material onto a workpiece, said apparatus comprising:

a chamber;

a first target disposed in the chamber;

a workpiece support located in the chamber opposite the first target;

an RF coil disposed in the chamber between the first target and the workpiece support, said RF coil including a re-sputtering surface of electrically conductive non-target material which faces towards the workpiece support and is in shadow relative the first target and which receives a coating of target material for re-sputtering onto the workpiece;

a second target interposed between the RF coil and the workpiece support which includes a sputtering surface which confronts the re-sputtering surface which is in shadow relative the first target and which supplies at least a portion of the coating of target material to the re-sputtering surface which is in shadow relative the first target; and means for biasing the first and second targets;

wherein the second target is disposed generally between an outer periphery of the support and an outer periphery of the RF coil;

wherein at least a part of the sputtering surface of the second target is inclined away from the RF coil and towards the support.

2. Sputtering apparatus for depositing material onto a workpiece, said apparatus comprising:

a chamber;

a first target disposed in the chamber;

a workpiece support located in the chamber opposite the first target;

an RF coil disposed in the chamber between the first target and the workpiece support, said RF coil including a re-sputtering surface of electrically conductive non-target material which faces towards the workpiece support and is in shadow relative the first target and which receives a coating of target material for re-sputtering onto the workpiece;

a second target interposed between the RF coil and the workpiece support which includes a sputtering surface which confronts the re-sputtering surface which is in shadow relative the first target and which supplies at least a portion of the coating of target material to the re-sputtering surface which is in shadow relative the first target; and means for biasing the first and second targets;

wherein the second target is disposed generally between an outer periphery of the support and an outer periphery of the RF coil;

wherein the second target is formed on a ring; and wherein the ring is generally a frusto triangle in cross-section such that the sputtering surface of the second target includes an upper surface portion and first and second side surface portions on opposite sides of the upper surface portion, wherein the first side surface portion is inclined towards the outer periphery of the support and the second side surface portion is inclined towards the outer periphery of the RF coil.

* * * * *